United States Patent
Hafizovic et al.

(10) Patent No.: US 8,860,505 B2
(45) Date of Patent: Oct. 14, 2014

(54) LOCK-IN AMPLIFIER WITH PHASE-SYNCHRONOUS PROCESSING

(71) Applicants: Sadik Hafizovic, Zürich (CH); Flavio Heer, Nürensdorf (CH); Patrick Merkli, Wettingen (CH)

(72) Inventors: Sadik Hafizovic, Zürich (CH); Flavio Heer, Nürensdorf (CH); Patrick Merkli, Wettingen (CH)

(73) Assignee: Zurich Instruments AG (CH)

( * ) Notice: Subject to any disclaimer, the term of this patent is extended or adjusted under 35 U.S.C. 154(b) by 103 days.

(21) Appl. No.: 13/758,113

(22) Filed: Feb. 4, 2013

(65) Prior Publication Data

US 2014/0218103 A1 Aug. 7, 2014

(51) Int. Cl.
H03F 3/38 (2006.01)

(52) U.S. Cl.
CPC ........................................ H03F 3/38 (2013.01)
USPC ........................................................ 330/10

(58) Field of Classification Search
USPC ..................... 330/10; 329/323, 325, 358, 360
See application file for complete search history.

(56) References Cited

U.S. PATENT DOCUMENTS

| | | | | |
|---|---|---|---|---|
| 3,764,924 A | * | 10/1973 | Caplan et al. ................. | 329/362 |
| 4,263,558 A | * | 4/1981 | Mitter .............................. | 330/10 |
| 4,511,848 A | * | 4/1985 | Watson .......................... | 329/349 |
| 4,542,346 A | * | 9/1985 | McNeilly ....................... | 327/558 |
| 4,807,146 A | | 2/1989 | Goodrich et al. ............. | 364/481 |
| 4,914,677 A | | 4/1990 | Yamaguchi et al. .......... | 375/106 |
| 5,210,484 A | * | 5/1993 | Remillard et al. ............ | 324/118 |
| 5,371,588 A | | 12/1994 | Davis et al. ................... | 356/349 |
| 6,097,197 A | | 8/2000 | Matsuyama et al. .......... | 324/750 |
| 6,618,148 B1 | | 9/2003 | Pilgrim et al. ................. | 356/432 |
| 6,823,724 B1 | | 11/2004 | Kobayashi et al. ............. | 73/105 |
| 8,180,309 B2 | * | 5/2012 | Kimmig et al. ................ | 455/295 |
| 2003/0137216 A1 | | 7/2003 | Tamayo de Miguel et al. ............................. | 310/311 |
| 2006/0148441 A1 | | 7/2006 | Zinser ........................... | 455/336 |
| 2007/0007956 A1 | | 1/2007 | Min ............................... | 324/260 |
| 2007/0026830 A1 | | 2/2007 | Guilford ....................... | 455/260 |
| 2007/0272005 A1 | | 11/2007 | Abe et al. ......................... | 73/105 |
| 2009/0115416 A1 | | 5/2009 | White et al. .................. | 324/316 |
| 2010/0074371 A1 | | 3/2010 | West .............................. | 375/316 |
| 2010/0241009 A1 | | 9/2010 | Petkie ........................... | 600/484 |
| 2011/0074476 A1 | | 3/2011 | Heer et al. ..................... | 327/156 |
| 2012/0313697 A1 | | 12/2012 | Hafizovic et al. ............. | 329/323 |

OTHER PUBLICATIONS

Time Synchronous Averaging, Copyright 2009, Crystal Instruments.
Signal Recovery, What is a Boxcar Averager? Technical Note TN 1005, V1.0 12/04UK 2004 AMETEK Advanced Measurement Technology, Inc.
PerkinElmer Instruments, What is a Lock-in Amplifier? Technical Note TN 1000 V2.1 04/00UK PerkinElmer Inc. 2000.
Silicon Labs, AN575, Introduction to FPGA-based ADPLLs, Rev. 0.1 3/11 Copyright 2011 by Silicon Laboratories AN575.
Cova, S. et al., Versatile digital lock-in detection technique: Application to Spectrofluorometry and other fields, Rev. Sci. Instrum. vol. 50, No. 3, Mar. 1979 Digital Lock-in Detection.

(Continued)

*Primary Examiner* — Steven J Mottola
(74) *Attorney, Agent, or Firm* — Ostrolenk Faber LLP

(57) ABSTRACT

The presented device is the combination of a lock-in amplifier unit (1) and a phase-synchronous processing unit (2). This combination leads to a multitude of valuable signal analysis and conditioning possibilities. Amongst others, these possibilities include (i) extraction of time-domain properties of the input signal, (ii) extraction of statistical properties of the input signal, (iii) extraction of frequency-domain properties of the input signal, and (iv) preconditioning of the lock-in input signal.

25 Claims, 6 Drawing Sheets

(56) References Cited

OTHER PUBLICATIONS

Optronic Laboratories, Application Note (A12), The Benefits of DSP Lock-in Amplifiers, Revision: A, Sep. 1996.

PerkinElmer Instruments, The Digital Lock-in Amplifier, Technical Note TN 1003, V2.0 04/00UK PerkinElmer Inc. 2000.

Gaspar, J., et al., Digital lock in amplifier: study, design and development with a digital signal processor, Microprocessors and Microsystems 28 (2004) 157-162.

Sonnaillon, M., et al., A low-cost, high-performance, digital signal processor-based lock-in amplifier capable of measuring multiple frequency sweeps simultaneously, Review of Scientific Instruments, 76 024703 (2005) American Institute of Physics.

Stefani, A., et al., Diagnosis of Induction Machines' Rotor Faults in Time-Varying Conditions, IEEE Transactions on Industrial Electronics, vol. 56, No. 11, Nov. 2009.

Benstetter, G., et al. A review of advanced scanning probe microscope analysis of functional films and semiconductor devices, Thin Solid Films, 517 (2009) 5100-5105.

Jacobs, H., et al., Practical aspects of Kelvin probe force microscopy, Review Scientific Instruments, vol. 70, No. 3, Mar. 1999.

Glatzel, T., et al. Amplitude or frequency modulation-detection in Kelvin probe force microscopy, Applied Surface Science, 210 (2003) 84-89.

Fukuma, T., et al., Surface potential measurements by the dissipative force modulation method, Review of Scientific Instruments, vol. 75, No. 11, Nov. 2004.

* cited by examiner

LOCK-IN AMPLIFIER WITH PHASE-SYNCHRONOUS PROCESSING

FIELD OF THE INVENTION

The invention relates to a lock-in amplifier, and in particular to the integration of a phase-synchronous processing (PSP) unit in a lock-in amplifier.

BACKGROUND OF THE INVENTION

Lock-in Amplification:

Lock-in amplification is a widely used technique to recover a signal of interest. It is a particular type of demodulation with specific requirements to the filter performance and flexibility in setting the demodulation frequency. Demodulation is performed on the measured signal in order to obtain the phase and the amplitude of the signal of interest at a specific frequency. Lock-in amplification is equally used to narrow band signal and wide band signal analysis.

FIG. 1 shows a conventional analog lock-in amplifier (LIA). An analog input signal s(t) around a center frequency $f_0$ is multiplied with the signals $\sin(2\pi f_0 t)$ and $\cos(2\pi f_0 t)$, revealing the so-called in-phase and out-of-phase component of the signal. The fundamental frequency $f_0$ is extracted from a reference signal r(t). By this operation, the center frequency of the input signal is shifted to DC or an intermediate frequency and unwanted frequency components are removed by the subsequent low-pass filter. The output d(t) of the lock-in amplifier represents amplitude and phase of the input signal around f0.

In a digital lock-in amplifier, all calculations are carried out with digital numbers in a virtually error-free manner. The main source for non-idealities is the performance of the analog-to-digital converter. A digital lock-in amplifier is shown in FIG. 2. The basic principle is the same as for the analog lock-in amplifier, but the input signal is converted to digital values before it is being demodulated by the multiplier and fed to the subsequent low-pass filter. The reference signal is also digitized, often by means of a simple comparator. The remaining operations are the same as for the analog lock-in amplifier, but they are conducted in the digital domain. A digital implementation has several advantages since drift problems, non-linearity and non-idealities in multiplication or filtering are basically non-existent.

Phase-Synchronous Processing:

Phase-synchronous processing (PSP) can be applied if a signal of interest is periodic and if knowledge of the fundamental frequency $f_0$ of the signal is available. In PSP, a given number of periods of the signal of interest is combined in order to obtain a phase-domain signal. A block diagram of a PSP unit is depicted in FIG. 3. The input signal s(t) and the reference signal r(t) are periodic with the same fundamental frequency $f_0$ ($T_0 = 1/f_0$). Based on the reference signal r(t), the phase signal $\Phi(t)$ (in $[0, 2\pi)$) is derived. Note that the phase signal starts at 0 and increases linearly to $2\pi$ for each successive period of the reference signal. At each time instant t, the value of the input signal s(t) is associated with the actual phase $\Phi(t)$. Thereby, for each phase value $\Phi$ we obtain a sequence $<S>(\Phi)$ of signal values. Subsequently, the individual sequences are processed according to a given PSP operation, yielding the output $<s>(\Phi)$.

A well-known instance of this type of processing is phase-synchronous averaging, also known as time-synchronous averaging: multiple period snapshots are averaged in order to reduce noise components of the input signal.

In a digital implementation of PSP, the input signal s(t) and the reference signal r(t) are first converted to digital values. The subsequent processing is then carried out in the digital domain (see FIG. 4).

BRIEF SUMMARY OF THE INVENTION

It is a general object of the present invention to provide a lock-in amplifier of improved versatility.

In a first aspect, this and further objects of the invention are achieved by a lock-in amplifier comprising
an LIA unit having
a signal input for receiving an input signal s(t),
a reference signal generator providing a periodic reference signal,
a demodulator generating an unfiltered LIA-signal by multiplying said input signal and said reference signal,
a low-pass filter connected to said demodulator and filtering said unfiltered LIA-signal for generating a filtered LIA output signal, and
a PSP unit having
a value-phase association unit adapted to associate values of said input signal to a phase of said reference signal and to thereby generate phase-associated signal values, and
a signal processor connected to said value-phase association unit and calculating at least one function of said phase-associated signal values for generating a PSP output signal.

In another aspect, the invention relates to a lock-in amplifier comprising
a signal input for receiving an input signal s(t),
a phase extraction unit generating a phase value indicative of a current phase of a periodic reference signal,
a demodulator generating an unfiltered LIA-signal by multiplying said input signal and said reference signal,
a low-pass filter connected to said demodulator and filtering said unfiltered LIA-signal for generating a filtered LIA output signal,
a value-phase association unit connected to said phase extraction unit for receiving said phase value and adapted to associate values of said input signal to said phase value and to thereby generate phase-associated signal values, and
a signal processor connected to said value-phase association unit and calculating at least one function of said phase-associated signal values for generating a PSP output signal.

Hence, the present invention proposes the integration of a PSP unit into a lock-in amplifier. Even though lock-in amplifiers as well as PSP units have been used for many decades, a combination of the two types of devices has, to the inventors' present understanding, never been made. Such a combination provides numerous advantages.

In particular, the PSP output signal can be used as a basis to provide a wealth of additional information that is not available from the LIA output, such as frequency-domain information or time-domain information. For example, a real-time display of transients that are orders of magnitude faster than the reference frequency can be achieved when analyzing a short signal. Immediate feedback on harmonic distortions of the LIA signal can be obtained (harmonic analyzer), or statistical time-domain analysis tools can be provided that go beyond the accurate measurement of the signal RMS amplitude and that allow to make qualified statements regarding the signal waveform.

The present invention also provides the basis for a completely novel approach to build a multi-frequency lock-in amplifier with a very large number of harmonic frequencies measured concurrently with much more efficient resource use as compared to a multi-demodulator implementation. The number of harmonics analyzed simultaneously is limited by the resolution of the phase signal (which can be very large) and by the memory assigned for the bins (which can be large as well).

In a particularly advantageous embodiment, the value-phase association unit is connected to said reference signal generator, advantageously to its phase extraction unit, for receiving the phase of the reference signal. In other words, a common phase extraction can be used for the LIA unit as well as for the PSP unit.

In another advantageous embodiment the signal input comprises an analog-digital converter generating a series of digitized input signal values $s_i$ at a sampling interval $T_S$. The demodulator of the lock-in amplifier and the signal processor of the PSP are both connected to this analog-digital converter for receiving the signal values $s_i$. Hence, the PSP unit and the LIA unit can share the same analog-digital converter.

The lock-in amplifier further can comprise a reference input, with the reference signal generator being connected to this reference input and adapted to generate the (internal) reference signal from the input signal at the reference input. Alternatively, the (internal) reference signal can be derived from the input signal or from an internal oscillator.

The value-phase association unit is advantageously adapted to generate said phase-associated signal values as a sequence of values $s_{m,k}$ indicative of the value of the input signal at a phase interval $\phi_m$, wherein k is an index that increases with each new value in said phase interval $\phi_m$ and m is a phase interval index with m=0 ... M−1. This implies that the phase space is divided into bins. These bins may e.g. be user selected, or they may be an inherent consequence of the limited resolution of the phase extraction unit.

BRIEF DESCRIPTION OF THE DRAWINGS

The invention will be better understood and objects other than those set forth above will become apparent when consideration is given to the following detailed description thereof. Such description makes reference to the annexed drawings, wherein.

DETAILED DESCRIPTION OF THE INVENTION

Figure 5:
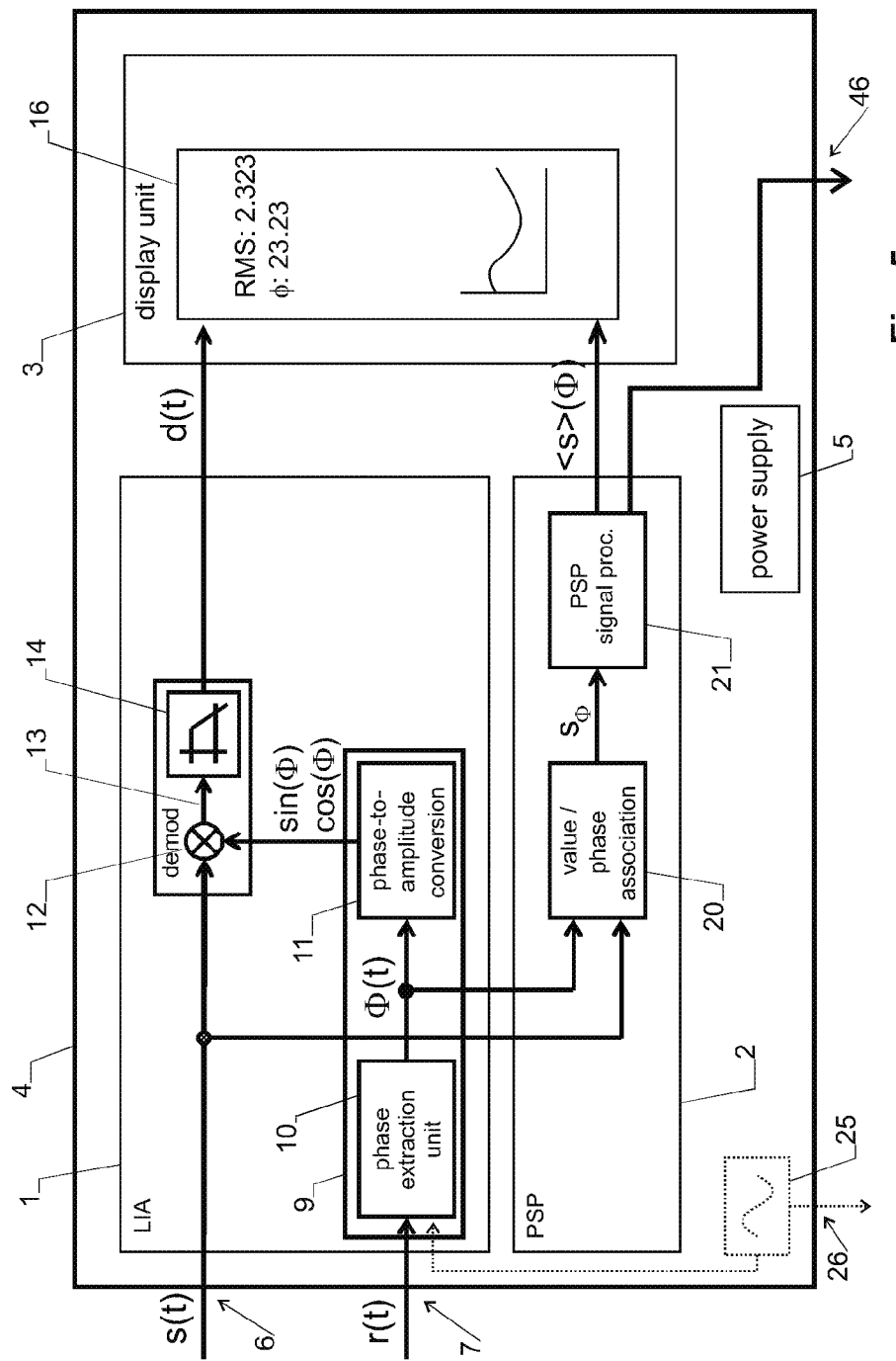
FIG. 5 shows a block diagram of a first embodiment of lock-in amplifier with PSP unit.

Device Overview:

The lock-in amplifier of FIG. 5 comprises an LIA unit 1 and a PSP unit 2 as well as a user interface unit 3. All of these components can be arranged in a common housing 4, together with other device units, such as a common power supply 5.

Further, the device has a signal input 6 for receiving an input signal s(t) and a reference input 7 for receiving a reference source signal r(t).

LIA unit 1 provides the lock-in amplifier functionality of the device. It comprises a reference signal generator 9 which includes a phase extraction unit 10 that generates a phase value $\Phi(t)$ (with $0 \leq \Phi(t) < 2\pi$) indicative of the current phase within the phase cycle of a reference signal. This phase value $\Phi(t)$ is fed to a phase-to-amplitude conversion unit or synthesizer 11, which also forms part of the reference signal generator 9 and generates the values $\sin(\Phi(t))$ and $\cos(\Phi(t))$ which represent the (internal) periodic reference signal at a fundamental frequency f0. The reference signal is fed to a demodulator 12, which e.g. multi-plies the reference signal with the input signal s(t), thereby generating an unfiltered LIA-signal 13. This unfiltered LIA-signal is fed to a low-pass filter 14 for generating a filtered LIA output signal d(t). Low-pass filter 14 can be any suitable device with a cut-off frequency lower than the frequency of the reference signal. The filtered LIA-signal d(t) at the output of low-pass filter 14 is fed to interface unit 3 to be displayed on a display 16, e.g. in the form of an RMS value and a phase.

PSP unit 2 comprises a value-phase association unit 20 adapted to associate the values of the input signal s to the phase $\Phi$ of the reference signal and to thereby generate "phase-associated signal values" $s_\Phi$.

In an analog embodiment of the device, the number of possible values of phase $\Phi$ is unlimited. However, in an advantageous embodiment, value-phase association unit 20 will be implemented as a digital device. In this case, the number of phase values is limited. Further, the number of phase values to be distinguished can also be limited by binning, as described further below. Therefore, for the embodiments described in the following, it will be assumed that there is a limited number of phase intervals $\phi_m$, with m=0 ... M−1, that are of interest. In this case, value-phase association unit 20 will generate a series of values $s_{m,k}$ indicative of the value of the input signal s(t) in phase interval $\phi_m$. k is an index that increases with each new value in said phase interval $\phi_m$.

For example, for evenly distributed phase intervals between 0 and $2\pi$, the interval $\phi_m$ is the interval [$2\pi \cdot m/M$, $2\pi \cdot (m+1)/M$). The signal in phase interval $\phi_m$ will differ between the periods of the reference signal, i.e. value-phase association unit 20 will generate a series of values $s_{m,k}$.

The phase-associated signal values $s_{m,k}$ are fed to a PSP signal processor 21, which calculates at least one function $\Gamma(s_{m,k})$ thereof. For example, function $\Gamma(s_{m,k})$ may e.g. be a vector-valued function providing the average $a_m$ of the values $s_{m,k}$ averaged over a number K of the most recently measured values in phase interval $\phi_m$.

The result of the function $\Gamma(s_{m,k})$, i.e. the output of PSP signal processor 21, can be made available on a device output in the form of an analog voltage or a digital value. FIG. 5 shows such a PSP output carrying the output signal of the PSP signal processor under reference number 46. Such an output can have a precise time relation in respect to the input signal.

The device shown in FIG. 5 may be implemented in analog and/or digital techniques. A digital implementation will be described in more detail below.

In the embodiment of FIG. 5 the reference signal that determines the phase $\Phi(t)$ and that is used in LIA unit 1 as well as in the PSP unit 2 is derived from the externally provided reference source signal.

Alternatively, the reference source signal may also be generated internally, e.g. by an oscillator 25 built into the lock-in amplifier, as shown in dotted lines in FIG. 5. In this case, the reference source signal can also be provided at a reference output 26 of the device for being used to synchronize external circuitry. Depending on its implementation, oscillator 25 may take over part or all of the functionality of phase extraction unit 10 and phase-to-amplitude converter 11.

Figure 6:
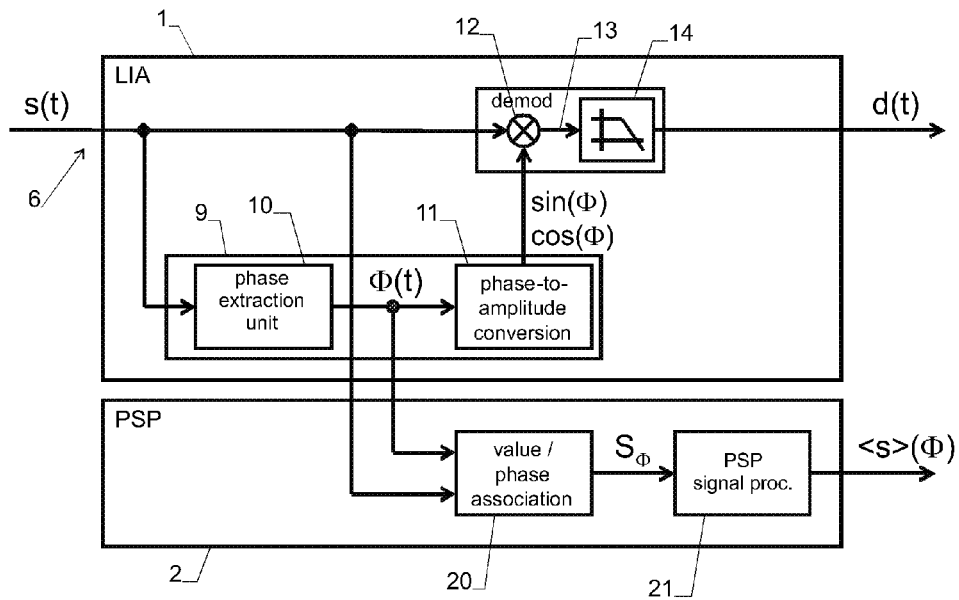
FIG. 6 shows a block diagram of a second embodiment of lock-in amplifier with PSP unit.

Yet another alternative embodiment is shown in FIG. 6, where the input signal s(t) is used as reference source signal.

(It must be noted that FIG. 6 as well as some of the following figures only show LIA unit 1 and PSP unit 2, without the other components of the device, such as user interface unit 3 and housing 5, which are advantageously present in all the embodiments.)

Figure 7:
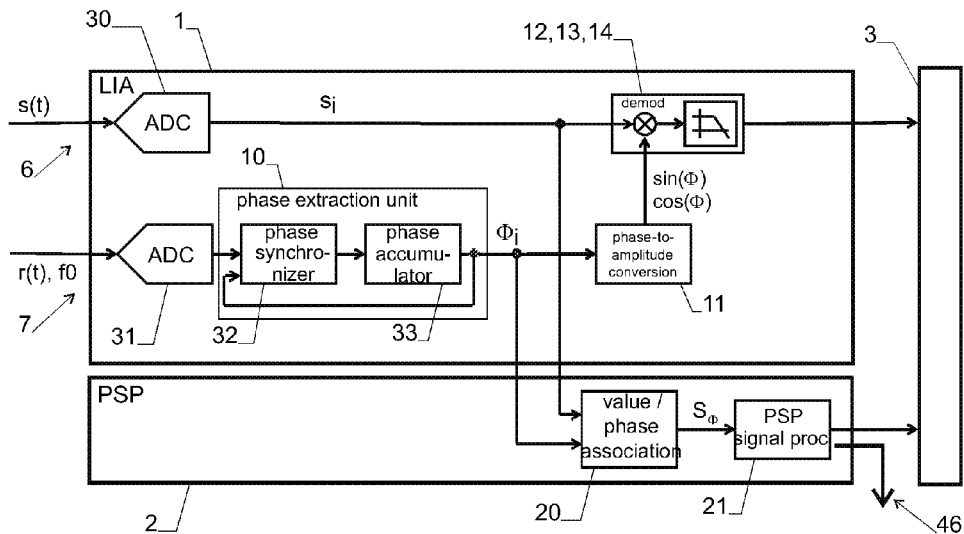
FIG. 7 shows a block diagram of a the of lock-in amplifier of FIG. 5 in digital implementation.

Digital Implementation:

FIG. 7 shows LIA unit 1 and PSP unit 2 of a digital implementation of the device. Such a device can e.g. be implemented in an FPGA.

As can be seen, the signal input 6 of the device comprises a first analog-digital converter 30 generating a series of digitized input signal values $s_i$ at a sampling interval $T_S$. The sampling times are advantageously not in a fixed phase relationship with the reference signal, i.e. they are asynchronous thereto, but they are advantageously much shorter than a period of the reference signal.

Similarly, the reference source signal is also fed to a second analog-digital converter 31, which, in a simple embodiment, may be a comparator. The values from analog-digital converter 31 are fed to a phase synchronizer 32 and a phase accumulator 33, which form part of phase extraction unit 10. Phase synchronizer 32 and phase accumulator 33 form a digital PLL as known to the skilled person.

Phase accumulator 33 provides, for each sampling interval i, a phase value $\Phi_i$, which indicates the current phase associated to the sampling interval i.

The output values $\Phi_i$ from phase accumulator 33 are fed to phase-to-amplitude conversion unit or synthesizer 11, which generates the values $\cos(\Phi_i)$ and $\sin(\Phi_i)$ to be fed to demodulator 12. Demodulator 12 calculates, for each sampling interval i, the values $s_i \cdot \sin(\Phi_i)$ and $s_i \cdot \cos(\Phi_i)$, which are then fed to low-pass filter 13 for digital filtering. The filtered signals $d_i$ (which represent e.g. the real and imaginary part of the input signal at the frequency of the reference signal) are then fed to user interface unit 3 for being displayed on display 16.

Value-phase association unit 20 is connected to phase extraction unit 10 for receiving, for each sampling interval i, the associated phase value $\Phi_i$. Using this phase value $\Phi_i$, it determines a phase interval $\phi_k$ that the phase value falls into. For this purpose, the device defines a plurality of non-overlapping phase intervals $\phi_m$ with m=0 ... M−1 in most cases with M>1, typically M>>10. Value-phase association unit 20 attributes phase value $\Phi_i$ to the phase interval $\phi_m$ that value $\Phi_i$ falls into. Hence, over the course of several periods of the reference signal, value-phase association unit 20 generates, for each phase interval $\phi_m$, a series $s_{m,k}$ of values indicative of the value of the input signal s(t) in phase interval $\phi_m$.

(Note: More details on the definition of the phase intervals $\phi_m$ are given below, in the section "Binning").

PSP signal processor 21 performs a mathematical operation on at least some of the values $s_{m,k}$, thereby generating the PSP output signal as described above.

Binning:

As mentioned above, value-phase association unit 20 advantageously associates each sampled input value with a phase interval $\phi_m$, and this phase interval is derived from the current phase value $\Phi_i$ (or, in an analog device, $\Phi(t)$). Theoretically, in a digital implementation, there could be a phase interval $\phi_m$ associated to each possible phase value $\Phi$. However, the resolution of the phase value $\Phi$ is typically high-advantageously, phase accumulator 33 has a length of at least 32 bits, in particular at least 40 bits, e.g. 48 bits. In such a case, it is impracticable to define a corresponding number of e.g. $M=2^{48}$ phase intervals.

Typically, the number M of phase intervals will be much smaller than the number of different possible values of phase value $\Phi$ provided by phase extraction unit 10. Typically, the number M will be larger than 1, in particular larger than 8, e.g. 256 or 1024. It must be noted, however, that M may also be 1, e.g. if PSP unit 2 only comprises a boxcar as described below.

In a simple embodiment, the phase intervals $\phi_m$ can be defined to be equidistantially distributed over the range $[0 \ldots 2\pi)$ by defining $\phi_m = [2\pi \cdot m/M, 2\pi \cdot (m+1)/M)$, as mentioned above.

In a more advanced embodiment, the present device can comprise a binning selector 35 that comprises user operatable controls operated through interface unit 3. Binning selector 35 allows the user to define the phase intervals $\phi_m$. For example, the user operatable controls of binning selector 35 allow the user to select the number M of bins, the lower-bound frequency $\Phi_{min}$ of the first bin $\phi_0$ and the upper-bound frequency $\Phi_{max}$ of the last bin $\phi_{M-1}$. This information is fed to a phase binning unit 36, which is adapted to determine the phase interval $\phi_m$ for each phase $s_i$ of the input values $s_i$.

Phase binning unit 36 stores then stores input value $s_i$, or a processed value derived therefrom, in a location of a memory 37, which location is attributed to the attributed phase interval $\phi_m$. If a value does not fall into any of the intervals $\phi_m$, it can e.g. be discarded or be stored in a location of memory 37 designated to receive all values not attributed to an interval $\phi_m$.

Figure 8:
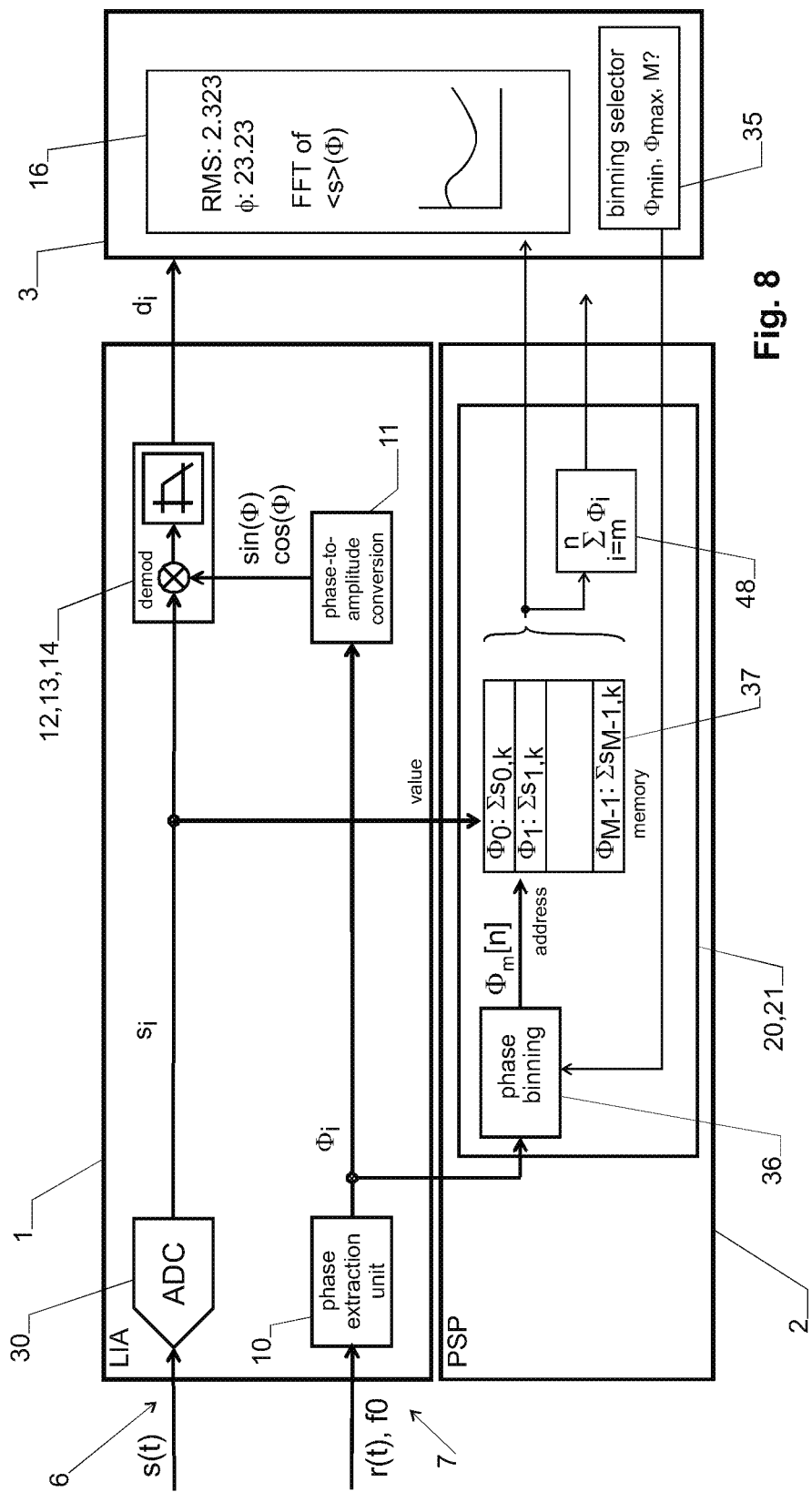
FIG. 8 shows a further embodiment of a lock-in amplifier with binning capability.

In the embodiment shown in FIG. 8, memory 37 stores, for each phase interval $\phi_m$, the sum of the values attributed to this phase interval, e.g. summed over a total number K of values. This corresponds, up to a scaling factor, to the average of the values in the given phase interval. This average can be fed to interface unit 3 in order to be displayed e.g. in a graph showing the average value for each phase interval $\phi_m$ and/or a Fourier transform of the phase intervals $\phi_m$. The mentioned average values of the phase intervals may be further combined, e.g. averaged, and sent to an analog device output as shown by summing subunit 48 of FIG. 8.

Figure 1:
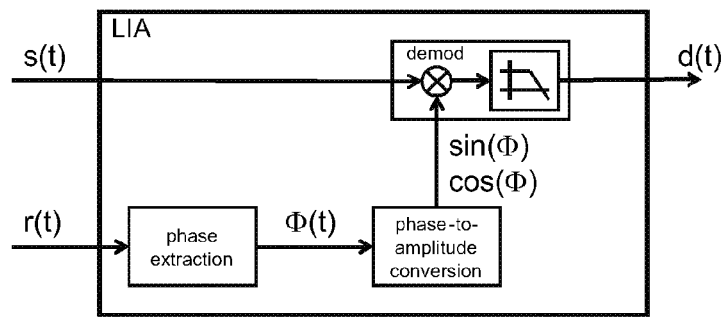
FIG. 1 shows the block-diagram of a prior art lock-in amplifier.
Figure 2:
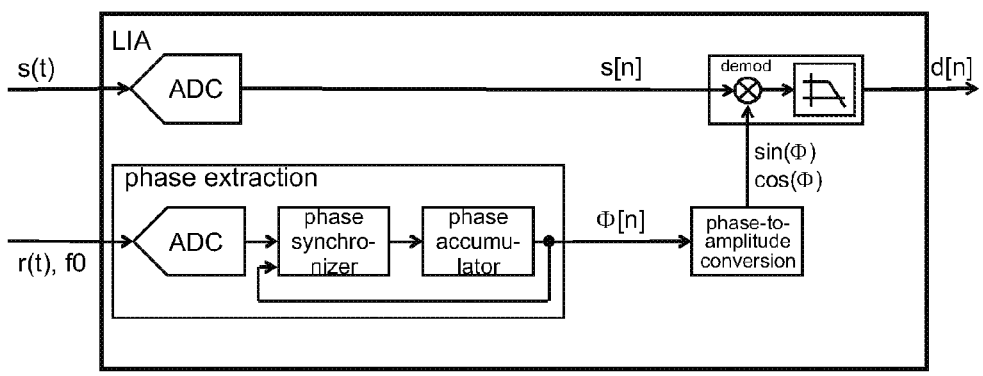
FIG. 2 shows the block-diagram of a prior art digital lock-in amplifier.
Figure 3:
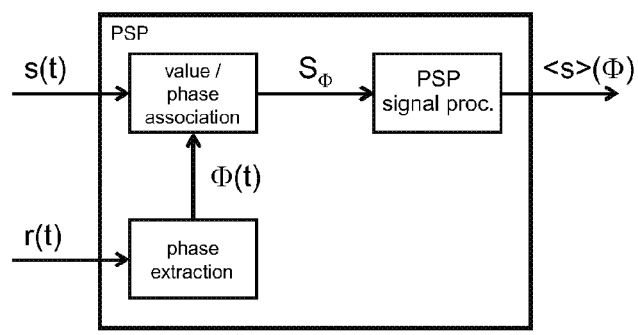
FIG. 3 shows the block-diagram of a prior art PSP unit.
Figure 4:
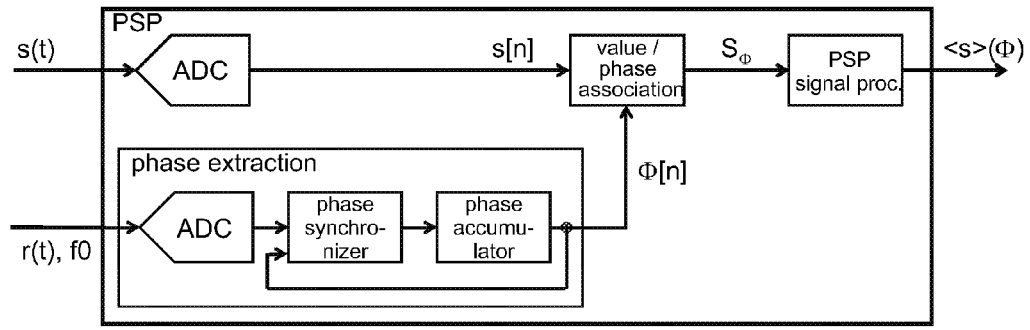
FIG. 4 shows the block-diagram of a prior art digital PSP unit.
Figure 9:
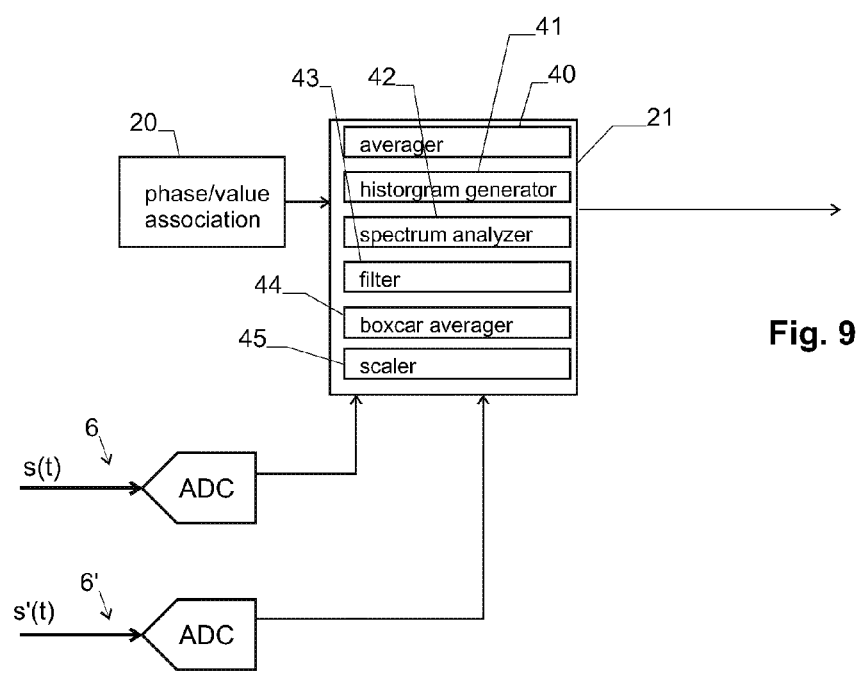
FIG. 9 shows a number of components that can be integrated into the PSP signal processor.

PSP Signal Processor:

FIG. 9 illustrates some examples of the operations that can be carried out by PSP signal processor 21:

As mentioned, PSP signal processor 21 can comprise an averager 40 for calculating the average of the values received in each phase interval $\phi_m$, i.e. it calculates values $g_0 \ldots g_{M-1}$ as $$g_m = \frac{1}{K} \sum_{k=0}^{K} s_{m,k} \tag{1}$$

PSP signal processor 21 can also comprise a histogram generator 41 for calculating parameters $G_m$ indicative of a distribution of said signal values $s_{m,k}$ in said phase interval $\phi_m$, i.e.

$$G_m = \text{hist}(s_{m,0}, \ldots s_{m,K-1}) \tag{2}$$

PSP signal processor 21 can comprise a spectrum analyzer 42 analyzing the frequency spectrum over the values received in all phase intervals. Spectrum analyzer 42 e.g. calculates the Fourier transform (FFT or DFT) over the values obtained in the different phase intervals $\phi_m$.

Advantageously, these values were first filtered in low-pass filter 43 or averaged in averager 40. Spectrum analyzer 43 can also be adapted to calculate the total harmonic distortion THD of the values obtained in the different phase intervals $\phi_m$—THD describes the harmonics present over frequency $f_0$ of the reference signal, which is a value that is usually not available on lock-in amplifiers.

PSP signal processor 21 can comprise a filter 43 for filtering the values for each phase interval $\phi_m$ over time, e.g. in a low-pass filter, thereby generating a filtered value $f_m$ for each phase interval $\phi_m$.

PSP signal processor 21 can combine values obtained for different phase intervals $\phi_i$ and $\phi_j$, e.g. in order to filter over a broader phase interval.

PSP signal processor 21 can also allow to route the unfiltered values for each phase interval $\phi_m$ to user interface unit 3 in order to display the unfiltered shape of the input signal as a function of the phase of the reference signal.

PSP signal processor 21 can also comprise a boxcar averager 44, which integrates (i.e. low-pass filters) the signal values in at least one subinterval I of the phase of the reference signal and outputs the filtered value. This interval can be selected by the user. The sampled signal values $s_i$ whose phase falls into subinterval I are integrated and, advantageously, averaged over several periods of the reference signal. Subinterval I may be one of the phase intervals $\phi_m$ or any other phase interval selected by the user.

PSP signal processor 21 can also comprise a scaler 45, which scales the values in the phase intervals $\phi_m$ with differing scaling factors $b_m$. Scaler 45 can e.g. be combined with averager 40 for creating a scaler/averager.

The device can also comprise several signal inputs 6, 6' and the PSP unit can be adapted to process the input signals s(t), s'(t) of all these signal inputs to thereby, e.g., compare and/or combine these input signals.

Through user interface unit 3, the user can select which of these components is/are to be used and/or how they are to be combined.

Note: The number K of signals to be processed in each phase interval $\Phi_m$, e.g. in equations (1) or (2) above, may depend on the index m, e.g. when one phase interval receives much more sampled values than another phase interval.

User Interface Unit:

As mentioned, display 16 of user interface unit 3 can be used to display LIA output d(t). In addition to this, it can be used to display the output of PSP unit 2. The user can select which output data is to be displayed.

In a particularly advantageous embodiment, interface unit 3 can display the filtered and/or unfiltered values of the input signal as a function of the phase of the reference signal in real time.

As mentioned, interface unit 3 can also display the spectrum of the input signal, as obtained through spectrum analyzer 43, together with LIA output d(t). The power of the harmonic components of up to half of the number of phase bins can be displayed.

Interface unit 3 can also display the histogram as calculated in histogram generator 41.

Several Phase Extraction Units:

The device may also comprise several phase extraction units and several PSP units if the input signal comprises several frequencies of interest.

Figure 10:
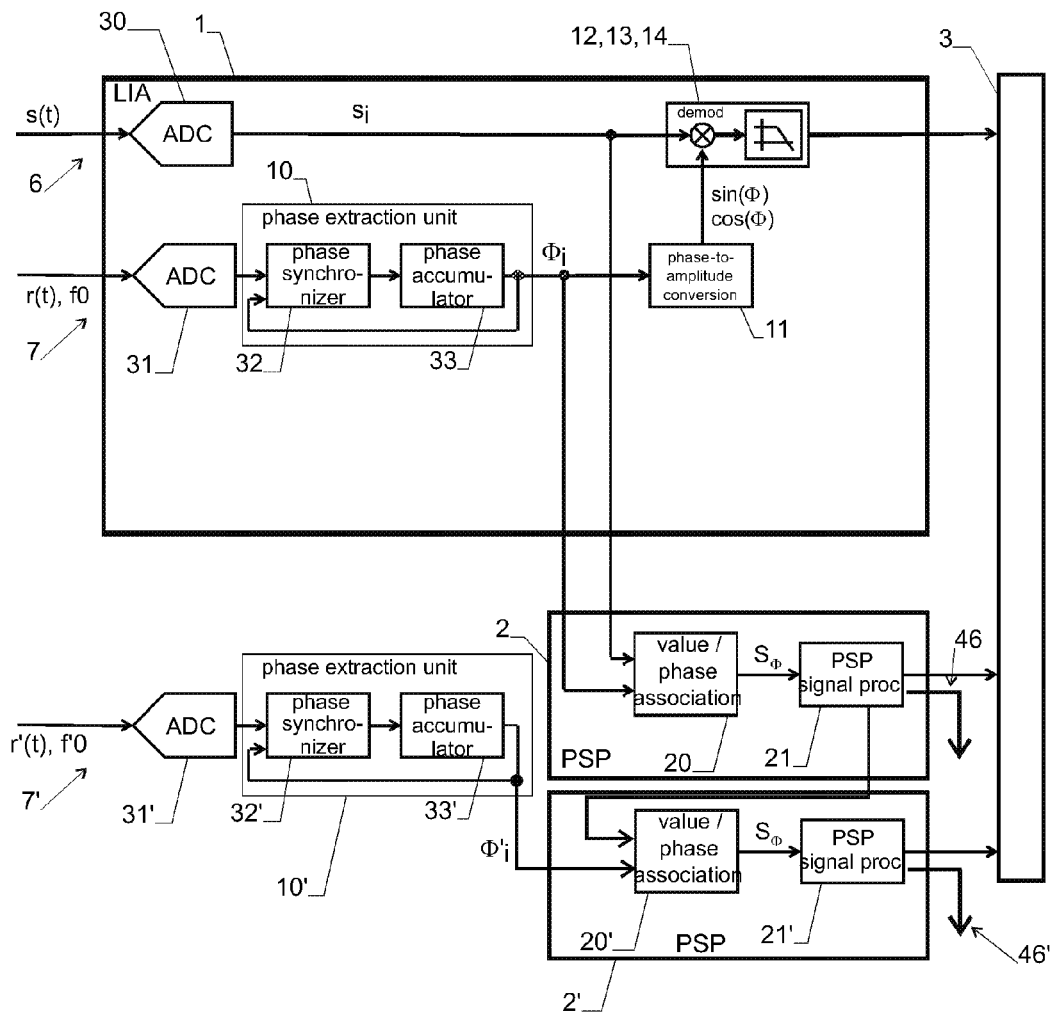
FIG. 10 shows a block-diagram of a lock-in amplifier with several phase extraction units.

FIG. 10 shows an embodiment with a second phase extraction unit 10' with its own reference input 7'. It generates its own phase signal $\Phi'_i$, which is fed to a second PSP unit 2'. Second PSP unit 2' comprises a second value-phase association unit 20' and a second PSP signal processor 21'. The signal input to second value-phase association unit 20' is e.g. derived from an output of the first PSP unit 2.

A device of the type of FIG. 10 can e.g. be used for analyzing a carrier signal at frequency f0 that is amplitude-modulated at a frequency f'0, with f'0 e.g. being smaller than f0. First PSP unit 2 is e.g. adapted as a boxcar analyzer, i.e. it integrates all values of a phase range $\Phi$min ... $\Phi$max. The resulting signal is then fed to second PSP unit 2', which analyzes the output value of first PSP unit 2, e.g. by taking the average of the output value of first PSP unit 2 in each subinterval $\phi'_m$ of the phase value $\Phi'$ derived of second phase extractor 7'.

In more general terms, a lock-in amplifier of the type of FIG. 10 comprises at least two phase extraction units 10, 10'. The phase extraction units 10, 10' generate phase values $\Phi$ and $\Phi'$ indicative of the current phase of several reference signals r(t), r'(t) of different frequencies f0, f'0.

Advantageously, the device can also comprise at least two PSP units 2, 2'. One phase extraction unit is attributed to each PSP unit and each PSP unit is adapted to analyze a signal in reference to the phase value of its attributed phase extraction unit.

Advantageously, the output of first PSP unit 2 can be fed as an input to second PSP unit 2', which e.g. allows to analyze a signal carrying two different frequencies.

Instead of using two separate PSP units 2, 2', a single PSP unit may be used that has inputs for several phase values $\Phi_i$, $\Phi'_i$ from the several phase extraction units 10, 10' and that calculates a function derived from the phase values and from the sampled input signal and associates it to pairs of the phase values $\Phi$ and $\Phi'$.

Notes:

Phase-synchronous processing in PSP unit 2 offers a wide palette of analysis and signal conditioning possibilities, which are very valuable in applications where a lock-in amplifier is used. These include Extraction of time-domain properties of the input signal, e.g., pulse arrival time and pulse shape reconstruction.

Extraction of statistical properties of the input signal, e.g., average periodic behavior and standard deviation of this average behavior.

Extraction of frequency-domain properties of the input signal, by application of subsequent frequency analysis, e.g., Fourier transform.

Preconditioning of the signal fed to the lock-in demodulator, e.g., noise reduction by phase-synchronous averaging. In this case, PSP unit 2 is adapted to generate a preconditioned signal, which is then fed to demodulator 12 of LIA unit 1 for further processing.

Harmonic components can be calculated easily. For example, when using 1024 bins, 512 harmonic components can be readily determined in efficient manner.

The presented device is the combination of a lock-in amplifier unit 1 and a phase-synchronous processing unit 2. This combination leads to a multitude of valuable signal analysis and conditioning possibilities. Amongst others, these possibilities include (i) extraction of time-domain properties of the input signal, (ii) extraction of statistical properties of the input signal, (iii) extraction of frequency-domain properties of the input signal, and (iv) preconditioning of the lock-in input signal.

While there are shown and described presently preferred embodiments of the invention, it is to be distinctly understood that the invention is not limited thereto but may be otherwise variously embodied and practiced within the scope of the following claims.

The invention claimed is:

1. A lock-in amplifier comprising
an LIA unit having
a signal input for receiving an input signal s(t),
a reference signal generator providing a periodic reference signal,
a demodulator generating an unfiltered LIA-signal by multiplying said input signal and said reference signal,
a low-pass filter connected to said demodulator and filtering said unfiltered LIA-signal for generating a filtered LIA output signal, and
a PSP unit having
a value-phase association unit adapted to associate values of said input signal to a phase of said reference signal and to thereby generate phase-associated signal values, and
a signal processor connected to said value-phase association unit and calculating at least one function of said phase-associated signal values for generating a PSP output signal.

2. The lock-in amplifier of claim 1 wherein said value-phase association unit is connected to said reference signal generator for receiving the phase of the reference signal.

3. The lock-in amplifier of claim 2 wherein said reference signal generator comprises a phase extraction unit generating a phase value indicative of a current phase of said reference signal and a synthesizer generating said reference signal from said phase value, wherein said value-phase association unit is connected to said phase extraction unit for receiving said phase value.

4. The lock-in amplifier of claim 3 wherein said signal input comprises an analog-digital converter generating a series of digitized input signal values $s_i$ at a sampling interval $T_S$, wherein said phase extraction unit comprises a digital phase accumulator providing, for each sampling interval i, a phase value $\Phi_i$.

5. The lock-in amplifier of claim 3 wherein said signal input comprises an analog-digital converter generating a series of digitized input signal values $s_i$ at a sampling interval $T_S$, wherein said demodulator and said value-phase association unit are both connected to said analog-digital converter for receiving said signal values $s_i$.

6. The lock-in amplifier of claim 1 further comprising a reference input, wherein said reference signal generator is connected to said reference input and is adapted to generate said reference signal from an input signal of said reference input.

7. The lock-in amplifier of claim 1 wherein said value-phase association unit is adapted to generate a sequence of values $s_{m,k}$ indicative of the value of said input signal at a phase interval $\phi_m$, wherein k is an index that increases with each new value in said phase interval $\phi_m$ and m is a phase interval index with m=0 . . . M−1.

8. The lock-in amplifier of claim 7 wherein said value-phase association unit and said signal processor comprise a phase binning unit and a memory, wherein said phase binning unit is adapted to determine the phase interval $\phi_m$ for each sampled signal value of the input signal and to store said sampled signal value, or a processed value derived from said sampled signal value, in said memory in a location attributed to said phase interval $\phi_m$.

9. The lock-in amplifier of claim 8 further comprising a binning selector comprising user operatable controls for selecting said phase intervals $\phi_m$.

10. The lock-in amplifier of claim 7 wherein M>1, in particular M>8.

11. The lock-in amplifier of claim 7 wherein said signal processor comprises a filter filtering the values for each phase interval $\phi_m$.

12. The lock-in amplifier of claim 7 wherein said signal processor comprises a histogram generator for generating, for each phase interval $\phi_m$, histogram parameters indicative of a distribution of said signal values $s_{m,k}$ in said phase interval $\phi_m$.

13. The lock-in amplifier of claim 7 further comprising a spectrum analyzer connected to said signal processor analyzing a spectrum of the values received in said phase intervals $\phi_m$.

14. The lock-in amplifier of claim 13 comprising a user interface unit displaying said spectrum and said LIA output.

15. The lock-in amplifier of claim 1 comprising a user interface unit displaying said PSP output and said LIA output.

16. The lock-in amplifier of claim 1 comprising a user interface unit displaying unfiltered and/or filtered values of said input signal as a function of phase of said reference signal.

17. The lock-in amplifier of claim 1 further comprising a boxcar averager that integrates the input signal values in at least one subinterval of the phase of the reference signal.

18. The lock-in amplifier of claim 1 further comprising a scaler scaling the values in the phase intervals $\phi_m$ with differing scaling factors.

19. The lock-in amplifier of claim 1 comprising a common housing which houses said LIA unit and said PSP unit.

20. The lock-in amplifier of claim 1 further comprising a PSP output carrying an output signal of said signal processor.

21. The lock-in amplifier of claim 1 comprising at least two phase extraction units, wherein said phase extraction units generate phase values indicative of a current phase of several reference signals of different frequency.

22. The lock-in amplifier of claim 21 comprising at least two PSP units, with one PSP unit attributed to each phase extraction unit, wherein each PSP unit is adapted to analyze a signal in reference to the phase value of its attributed phase extraction unit.

23. The lock-in amplifier of claim 22 where an output of a first PSP unit is fed as an input to a second PSP unit.

24. The lock-in amplifier of claim 1 comprising several signal inputs for several input signals, wherein said PSP unit is adapted to process said input signals.

25. A lock-in amplifier comprising
a signal input for receiving an input signal s(t),
a phase extraction unit generating a phase value indicative of a current phase of a periodic reference signal,
a demodulator generating an unfiltered LIA-signal by multiplying said input signal and said reference signal,
a low-pass filter connected to said demodulator and filtering said unfiltered LIA-signal for generating a filtered LIA output signal,
a value-phase association unit connected to said phase extraction unit for receiving said phase value and adapted to associate values of said input signal to said phase value and to thereby generate phase-associated signal values, and
a signal processor connected to said value-phase association unit and calculating at least one function of said phase-associated signal values for generating a PSP output signal.

* * * * *